US012300458B2

United States Patent
Li et al.

(10) Patent No.: US 12,300,458 B2
(45) Date of Patent: May 13, 2025

(54) OBJECTIVE LENS SYSTEM FOR FAST SCANNING LARGE FOV

(71) Applicant: ASML Netherlands B.V., Veldhoven (NL)

(72) Inventors: Shuai Li, Beijing (CN); Zhongwei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/498,984

(22) Filed: Oct. 31, 2023

(65) Prior Publication Data

US 2024/0145209 A1 May 2, 2024

Related U.S. Application Data

(63) Continuation of application No. 16/018,008, filed on Jun. 25, 2018, now Pat. No. 11,837,431, which is a continuation of application No. 15/007,873, filed on Jan. 27, 2016, now Pat. No. 10,008,360.

(60) Provisional application No. 62/107,716, filed on Jan. 26, 2015.

(51) Int. Cl.
*H01J 37/145* (2006.01)
*H01J 37/141* (2006.01)
*H01J 37/147* (2006.01)

(52) U.S. Cl.
CPC .......... *H01J 37/145* (2013.01); *H01J 37/141* (2013.01); *H01J 37/1472* (2013.01); *H01J 37/1474* (2013.01); *H01J 37/1477* (2013.01)

(58) Field of Classification Search
CPC .................................................. H01J 37/145
See application file for complete search history.

(56) References Cited

U.S. PATENT DOCUMENTS

| | | |
|---|---|---|
| 4,330,709 A | 5/1982 | De Chambost |
| 4,831,266 A | 5/1989 | Frosien et al. |
| 4,926,054 A | 5/1990 | Frosien |
| 5,734,164 A | 3/1998 | Sanford |
| 5,780,859 A | 7/1998 | Feuerbaum et al. |
| 6,194,729 B1 | 2/2001 | Weimer |
| 6,380,546 B1 | 4/2002 | Petrov et al. |
| 6,392,231 B1 | 5/2002 | Chen |
| 6,498,345 B1 | 12/2002 | Weimer et al. |
| 6,590,210 B1 | 7/2003 | Essers |
| 2002/0054284 A1 | 5/2002 | de Jager |
| 2004/0046125 A1 | 3/2004 | Chen |
| 2004/0173746 A1 | 9/2004 | Petrov |

(Continued)

*Primary Examiner* — Eliza W Osenbaugh-Stewart
(74) *Attorney, Agent, or Firm* — Finnegan, Henderson, Farabow, Garrett & Dunner LLP

(57) ABSTRACT

The device includes a beam source for generating an electron beam, a beam guiding tube passed through an objective lens, an objective lens for generating a magnetic field in the vicinity of the specimen to focus the particles of the particle beam on the specimen, a control electrode having a potential for providing a retarding field to the particle beam near the specimen to reduce the energy of the particle beam when the beam collides with the specimen, a deflection system including a plurality of deflection units situated along the optical axis for deflecting the particle beam to allow scanning on the specimen with large area, at least one of the deflection units located in the retarding field of the beam, the remainder of the deflection units located within the central bore of the objective lens, and a detection unit to capture secondary electron (SE) and backscattered electrons (BSE).

20 Claims, 8 Drawing Sheets

(56) References Cited

U.S. PATENT DOCUMENTS

2010/0102227 A1 4/2010 Chen et al.
2014/0175279 A1 6/2014 Agemura 4-plates　　　8-plates　　　12-plates

OBJECTIVE LENS SYSTEM FOR FAST SCANNING LARGE FOV

CLAIM OF PRIORITY

This application is a continuation of application Ser. No. 16/018,008, entitled "Objective Lens System for Fast Scanning Large FOV", filed Jun. 25, 2018, which is a continuation of application Ser. No. 15/007,873, entitled "Objective Lens System for Fast Scanning Large FOV", filed Jan. 27, 2016, which claims priority to U.S. Provisional Application No. 62/107,716 entitled "Objective Lens System for Fast Scanning Large FOV", filed on Jan. 26, 2015, all of which are incorporated by reference in their entireties.

FIELD OF THE INVENTION

The present invention relates to an electro-optical inspection system, and more particularly to a focusing and deflection assembly for fast scanning over a large field-of-view (LFOV) which is used in a charged particle beam column.

BACKGROUND OF THE INVENTION

The following description and examples are not admitted to be prior art by their mention in this Background section.

In order to enhance the yield and reliability of the semiconductor devices such as integrated circuits (ICs) and memory devices, examining the defects on the patterned wafer for the avoidance of them has been significant. The physical defects, such as foreign particles, scratch defects, residual defects, bridging defects and so on, cause the devices to fail electrically, for example, the short or open circuit. Furthermore, since deep sub-micrometer node devices are developed, new and more complicated manufacturing structures such as a dual damascene structure and a fin-shaped field effect transistor (FinFET) structure are utilized in the semiconductor devices. Therefore, new types of defects including latent defects, for instance, chemical mechanical polishing (CMP) scores, under-layer leakage, under-etch, missing, voids, voltage contrast (VC) defects, and non-virtual defects (NVDs) occur during the manufacturing phase. Besides, while the less than 20 nm manufacturing process is on line, it has been a big challenge for the observation of nano-size semiconductor devices. It is consequence that the optical inspection apparatus has been stretched to the limit of its capability at the inspection of these defects and tiny devices. Herein, the issue is effectively addressed by a charged particle beam apparatus, for example, an electron beam tool based on a scanning electron microscope (SEM), and the semiconductor manufacturing and the yield enhancement can be optimized by the apparatus.

However, in terms of examination throughput, the charged particle beam apparatus remains much slower than the optical one. To fill the gap, the industry has presented a two-stage defect examination that includes a defect-inspection apparatus rapidly finding at what positions on the wafer defects are and a defect-reviewing apparatus being used to analyze the detected defects by the defect-inspection apparatus. In the defect-inspection apparatus, because of its rapidness being important, a large beam current is to be acquired and to be used with LFOV scan. In the defect-reviewing apparatus, because of its resolution being high for analyzing defects, a small beam current is used to acquire a defect image at high resolution. To sum up, in operation of detecting defects on the wafer, a defect map is rapidly acquired by the defect-inspection apparatus at first, and then the defect-reviewing apparatus analyzes defects and identifies killer defects according to the defect map, which improves the throughput and saves the cost.

Thus, there is an increasing need for high-resolution and/or high-throughput charged particle beam apparatuses such as high-resolution and/or high-throughput SEMs in manufacture of the advanced semiconductor devices. Examples of such apparatuses are illustrated in U.S. Pat. No. 4,330,709, which discloses a SEM has two magnetic deflectors inside objective lens and the deflectors are spaced apart the objective lens by a ferrite to increase the response time. Additional examples of such apparatuses are illustrated in U.S. Pat. No. 6,380,546, which discloses a SEM focusing system that has a beam guiding electrode and two magnetic deflectors in an objective lens. One of the two magnetic deflectors is arranged in the focusing field of the objective lens and the other is downstream the former. Such the arrangement decreases the chromatic aberration of focusing and deflection to obtain high resolution image. Additional examples of such apparatus are illustrated in U.S. Pat. Nos. 4,831,266, 4,926,054, 5,780,859, 6,194,729, 6,498,345 and 6,590,210, which disclose a SEM objective lens system that has a beam guiding electrode passing through it and a retarding lens to decelerate and focus an electron beam at low energies for maintaining high-resolution. The beam guiding electrode is used to direct and accelerate the electron beam onto a specimen and then secondary electrons (SE) and/or back-scattered electrons (BSE) from the specimen are accelerated by the retarding lens for enhancing the detection performance of a detector. However, these prior arts do not provide with the throughput improvement, and in some cases of hidden defects, for example VC defects, can't be observed by these prior arts apparatuses. Additional examples of such apparatuses are illustrated in U.S. Pat. No. 6,392,231, which discloses a swing objective retarding immersion lens (SORIL) SEM to enhance the throughput of prior arts apparatuses by a method of LFOV scan. However, the very high voltage is needed to accelerate the charged particle beam resulting in the arcing problem.

Accordingly, the prevent invention develops a charged particle beam apparatus for improving the throughput of semiconductor devices. The apparatus is used to find the defect position, detecting latent defects, and especially defects positioned under the surface layer.

SUMMARY OF THE INVENTION

The following description of various embodiments of methods, compositions, and systems is not to be construed in any way as limiting the subject matter of the appended claims.

One embodiment relates to an objective system for focusing a charged particle beam. The system comprises an objective lens for focusing the beam onto a specimen, a beam guiding tube through the objective for the beam, a deflection device arranged in the objective for deflecting the beam to a first distance, and a scanning deflection unit for deflecting the beam to a second distance less than the first distance.

In one embodiment, the objective lens comprises a magnetic lens and an electrostatic lens, the beam guiding tube is an electrode for controlling the kinetic energy of the beam, and the deflection device comprises a first magnetic deflector for deflecting the beam and a second magnetic deflector for swinging the compound field of objective lens. In another embodiment, the electrostatic lens comprises a lower end of the beam guiding tube, a control electrode disposed below the beam guiding tube, and a stage.

In one embodiment, the scanning deflection unit arranged in the objective lens comprises a third magnetic deflector and a forth magnetic deflector which are spaced apart from a yoke by a ferrite tube. In another embodiment, the scanning deflection unit arranged below the beam guiding tube comprises a fifth magnetic deflector.

In one embodiment, the electrostatic lens comprises a lower end of the beam guiding tube, the scanning deflection unit disposed below the beam guiding tube, and a stage. In another embodiment, the scanning deflection unit adjusts a beam incidence angle from a tilt incidence angle to a normal incidence angle for the edge aberration.

Another embodiment relates to a charged particle beam device comprise a beam source for generating a primary beam, a beam guiding tubular electrode for accelerating the primary beam, a condenser lens for condensing the primary beam, an immersion magnetic objective lens to focus the primary beam onto a specimen, a first deflection unit disposed in the objective lens for large field of view scanning, a second deflection unit disposed in the objective lens for small field of view scanning, a retarding electrode disposed below the beam guiding tube for decelerating the beam, and at least one detection unit disposed above the lens to detect secondary and/or back-scattered particles emanated from the specimen.

In one embodiment, the device further comprises a plurality of apertures for limiting the primary beam. In another embodiment, the beam guiding tube extends from an anode of the beam source downward a lower pole piece of the objective lens.

In one embodiment, the first deflection unit comprises a first magnetic deflector accommodated in an upper portion of the objective lens for pre-deflecting the primary beam and a second magnetic deflector accommodated in the objective lens for swinging the objective lens. In another embodiment, the second deflection unit has a third magnetic deflector and a fourth magnetic deflector which are arranged between the first magnetic deflector and the second magnetic deflector and spaced apart from the immersion magnetic objective lens by a ferrite tube. In an additional embodiment, the retarding electrode adjusts a beam incidence angle from a tilt incidence angle to a normal incidence angle for the edge aberration.

Another embodiment relates to a method for directing a charged particle beam to a substrate, comprises the steps of generating a guiding field along a beam path to direct the beam to the substrate, generating a first deflection field within the guiding field to direct the beam in a predetermined direction, generating a second deflection field downstream of the first deflection field for deflecting the deflected beam for small field of view scanning and generating a third deflection field within the guiding field to produce a swing objective lens for a large field of view scanning.

In one embodiment, the swing objective lens comprises a magnetic lens and an electrostatic lens, the guiding field is provided by a beam guiding tubular electrode, the first deflection field is provided by a first magnetic deflector unit, the second deflection field is provided by a second magnetic deflector unit, and the third deflection field is provided by a third magnetic deflector unit. In another embodiment the electrostatic lens comprises the tubular electrode, a control electrode disposed below the tubular electrode, and a stage for supporting the substrate. In another embodiment the second magnetic deflector unit is accommodated in a yoke of the objective lens, the second magnetic deflector unit being spaced apart from the magnetic objective lens by a ferrite tube.

In one embodiment, the second magnetic deflector unit is arranged below the tubular electrode, and includes a ferrite tube near to the second magnetic deflector unit. In another embodiment, the electrostatic lens comprises the tubular electrode, the second magnetic deflector unit disposed below the tubular electrode, and a stage for supporting the substrate Another embodiment relates to an objective lens system comprises an objective lens including a yoke encompassing a coil, said yoke including a first pole piece and a second pole piece such that a magnetic field is leaked out from said first pole piece and second pole piece to focus a charged particle beam when said coil is excited, a first deflector unit, between said first pole piece and said second pole piece, for deflecting said charged particle beam to a first distance, a second deflector unit for deflecting said charged particle beam to a second distance smaller than said first distance, an electrostatic lens inside said objective and above said first deflector unit, and a ferrite for covering said second deflector unit from said magnetic field.

In one embodiment, the objective lens system further comprises a third deflector unit above said electrostatic lens for deflecting said charged particle beam. In another embodiment, said second deflector unit is above said first deflector unit.

In one embodiment, said second deflector unit is below said first and second pole pieces. In another embodiment, the first and second pole pieces configure an opening facing to said charged particle beam. In an additional embodiment, the first and second pole pieces configure an opening facing to a sample to be scanned by said charged particle beam.

Another embodiment relates to an objective lens system comprises an objective lens including a yoke encompassing a coil, said yoke including a first pole piece and a second pole piece such that a magnetic field is leaked out from said first pole piece and second pole piece to focus a charged particle beam when said coil is excited, a first deflector unit, between said first pole piece and said second pole piece, for deflecting said charged particle beam to a first distance, a second deflector unit, below said objective lens, for deflecting said charged particle beam to a second distance smaller than said first distance, and an electrostatic lens inside said objective lens. In an additional embodiment, said second deflector unit is an electrostatic electrode unit.

The embodiments of the systems mentioned above will be further configured as described herein. Furthermore, the embodiment of the method described above may be performed by any of the systems described herein.

BRIEF DESCRIPTION OF THE DRAWINGS

The present invention will be readily understood to those skilled in the art by the following detailed description in conjunction with the accompanying drawings, wherein the same or like reference numerals designate the same or like structural elements, and in which.

Figure 1A:
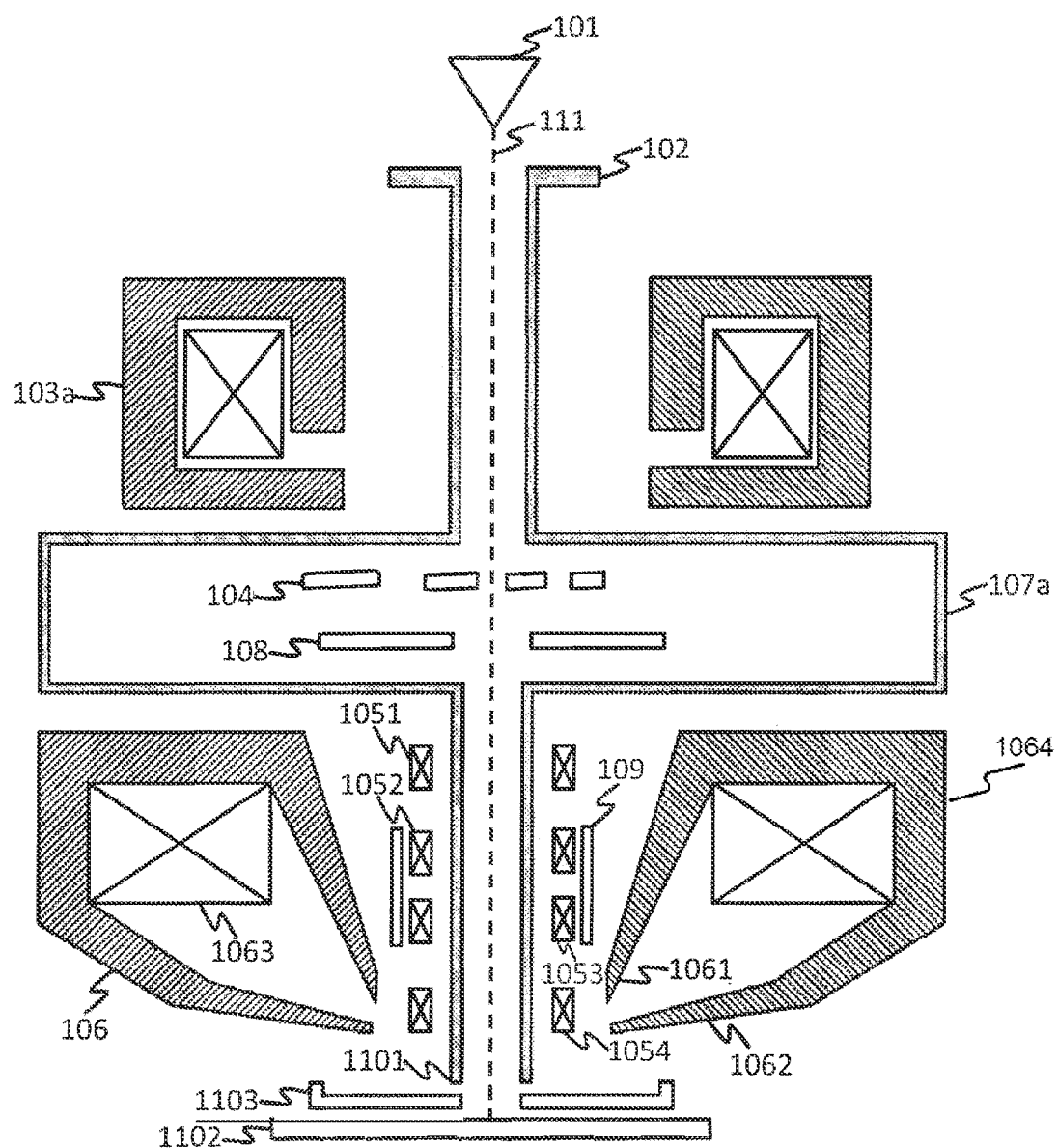
FIG. 1a is a diagram illustrating a cross-section of an embodiment of a scanning electron microscope (SEM) with a beam guiding tube, a scanning group of deflection units and a positioning group of deflection units in accordance with the present invention.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The preferred embodiment herein disclosed is not intended to be exhaustive or to limit the invention to the precise form disclosed. Rather, it is chosen and described in order to best explain the invention so that others skilled in the art may utilize its teachings. Besides, in alternative embodiments, those components identical to the components of the first embodiments are given the identical reference numerals without giving another reference numerals for simplicity.

Referring now to FIG. 1a, one embodiment of a defect-inspection apparatus with a large scan field and a large beam current to inspect the defects on the wafer is described below. First, a configuration of an e-beam inspection tool, which is an axially symmetric device, according to the invention comprises inter alia main parts as an electron beam source and an electron beam column. The electron beam source typically includes an electron beam source 101 for generating a primary electron beam, an anode 102 for accelerating the primary electron beam, a pre-condenser gun lens 103a for converging the primary electron beam, an aperture plate 104 with several apertures of different sizes for extracting a desired electron-beam size to be controlled by an aperture motor (not shown in FIG. 1a). It also typically comprises a beam blanking means, a Stigmator for correcting astigmatic aberrations, and a final aperture plate, which are not specifically shown. The anode 102 forms the source-side end of a beam guiding tube 107a in the present example. The beam guiding tube 107a of conductive materials, which acts as a tubular lens to generate a rotationally symmetrical electric field along the optical axis 111 to direct and accelerate the primary electron beam, passes through the bore of the magnetic objective lens 106, and ends at the specimen-side end of the magnetic objective lens 106 or in the region between a specimen 1102 and the magnetic objective lens 106. In this case, the gun lens 103a is a magnetic lens such that its magnetic field does not interact with the electric field of the beam guiding tube 107a and affects the propagation of the electron beam.

In another embodiment, the beam guiding tube 107a can also be made thickened at its specimen-side end that ends just below the objective lens 106.

Figure 1B:
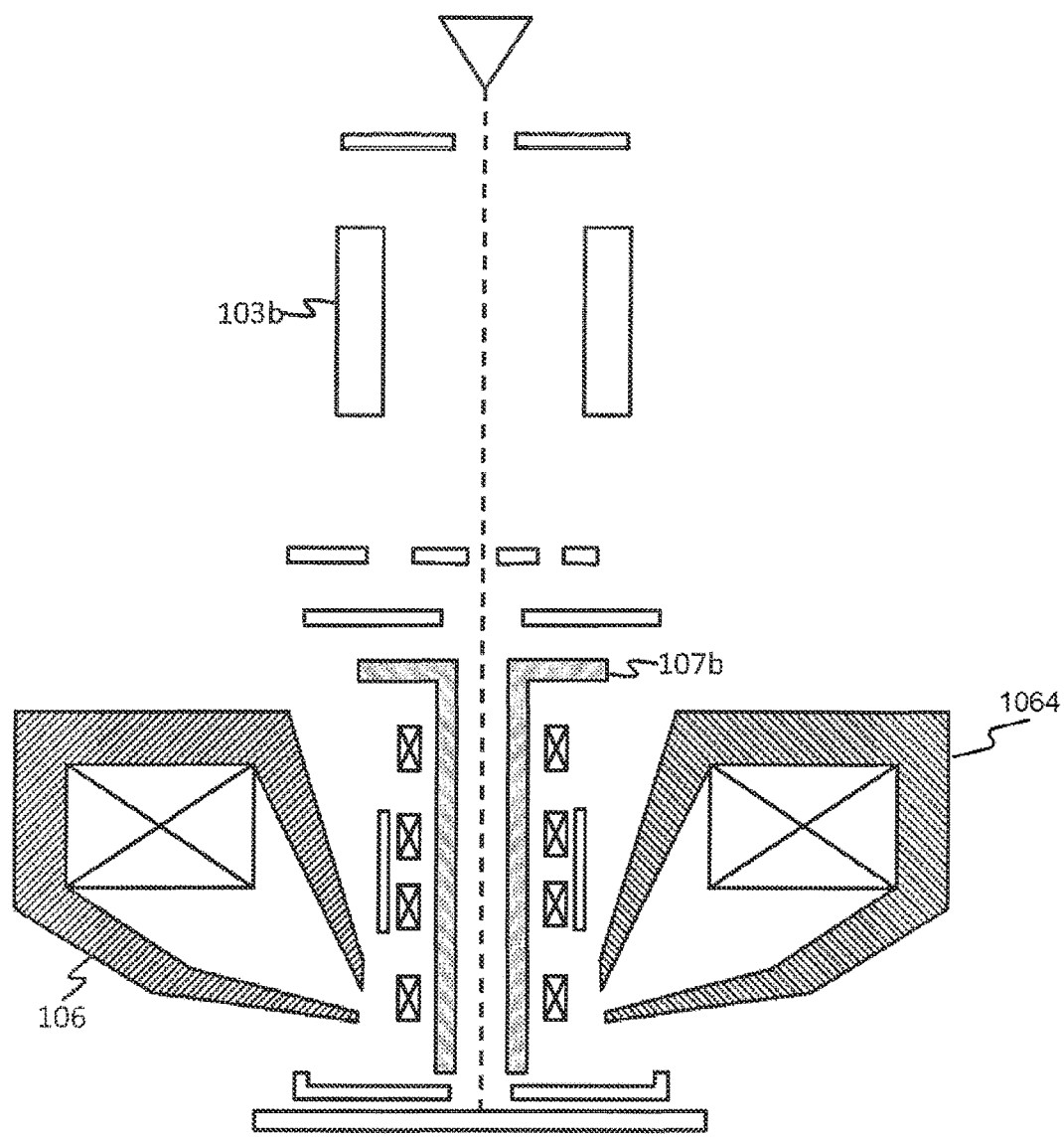
FIG. 1B is a diagram illustrating a cross-section of an alternative embodiment of FIG. 1a, whose pre-condenser lens and beam guiding tube are substituted by an electric lens and a shorter tube disposed only in the magnetic objective lens, respectively.

Alternatively to the illustration in FIG. 1a, as shown in the embodiment in FIG. 1B, the beam guiding tube 107b can also start form the source-side end of the magnetic lens 106 and ends at the specimen-side end of the magnetic lens 106, wherein the beam guiding tube 107b is made thickened at its source-side end. In the case, a gun lens 103b which is electric can also be used as an alternative to the magnetic one.

Further provided in the electron beam column, the magnetic objective lens 106 formed by two pole pieces 1061 and 1062 that surround a wind coil 1063, is used to focus the primary electron beam onto the specimen 1102 to be examined. An electrostatic retarding lens located downstream of the magnetic objective lens 106 in the embodiment of FIG. 1a, it is formed by selectively creating a potential difference between three electrodes 1101, 1102 and 1103. The specimen-side end of the beam guiding tube 107a serves as the first electrode 1101, the specimen surface serves as the second electrode 1102, and a third electrode 1103 disposed between the electrodes 1101 and 1102 serves as the control electrode.

In a SEM, in order to increase the image resolution, a spot size of the electron beam needs to be reduced up to nanometers. Typically, a highly accelerated electron beam is required to achieve the focusing purpose. It is generally produced using a desired potential difference between the electron beam source 101 and the anode 102 (referring to FIG. 1a). For instance, the beam source 101 voltage may be applied to (−1) KeV and the anode 102 voltage may be (+5) KeV, which results in the beam to leave the specimen-side end of the guiding tube 109 with the kinetic energy of 6 KeV. However, such a highly energized beam causes damages to the specimen 1102, and even charging for the case of dielectric specimens.

To eliminate the above problem, a low landing energy SEM (i.e., low-voltage scanning electron microscope, LVSEM) is demanded. Generally, decelerating the accelerated beam in the vicinity of the specimen 1102 is adopted to achieve LVSEM. The first electrode 1101 is at the anode potential, while the electrodes 1102 and 1103 are individually at an appropriate potential so as to decelerate the beam to a desired landing energy prior to hitting the specimen 1102. For example, the following voltages of 0 KeV (grounded) and 5 KeV may be applied to the specimen 1102 and the third electrode 1103, respectively, to accomplish the landing energy of 1 KeV. However, the desired deceleration not only limits the spatial resolution by the electron-electron interaction (Coulomb effect), but also increases chromatic aberration of focusing and deflection, especially at the edge of FOV, while the electron beam performs a raster scan. As a result, it causes a non-uniformity resolution such as image blurring.

To solve the above problem, the magnetic objective lens 106 with a short working distance (WD) is adopted in the embodiment of FIG. 1a. The aberration due to Coulomb effect increases with the WD, and so does the chromatic aberration for the proportionally increasing off-axis distance of the probe beam. Therefore, the spatial resolution can be improved by the magnetic objective lens 106 with the short WD.

A further deflection system comprises a first group (positioning group) of deflection units and a second group (scanning group) of deflection units, which are situated along the central axis of the electron beam column, and by means of it the primary beam enables the positioning and scanning movement of the primary beam over the specimen 1102 as LFOV scan. Furthermore, all the deflector units are magnetic deflectors due to the beam guiding tube 107a will shield outside electric fields. In accordance with the present invention, the first group of deflection units includes a first deflector 1051 for deflecting the primary electron 111 to a predetermined direction and a forth deflector 1054 for swing the objective retarding lens, wherein the forth deflector 1054 is located in the retarding field of the electrostatic retarding lens and the objective retarding lens is a compound lens of the objective lens 106 and the retarding lens. The combination of the deflectors 1051 and 1054 produces a deflection for positioning the primary beam (i.e., yielding a large deflection field), accurately but relatively slower, to a starting point over an area to be scanned. The second group of deflection units has a second deflector 1052 and a third deflector 1053, which act together to move the primary beam in a scanning motion over the area. Besides, they also compensate the chromatic aberration of deflection for each other. As a result, the scanning group is designed to permit the beam rapid scanning over the needed area while the positioning group maintains the position of the beam within the area, which achieves the LFOV scan. According to the embodiment of FIG. 1a, the objective lens system comprising the magnetic objective lens 106 and the deflection system is a swing objective retarding lens (SORL).

However, the large deflection field in SORL would yield the large aberrations. In order to limit them, it is preferred that the first order SORL condition for each deflection unit should be met:

$$D = -i[B(z) \times s + B'(z) \times s \times (z-z_0)/2]$$

wherein D is the magnetic field strength within the deflection unit, B(z) and B'(z) is respective the magnetic field from the magnetic objective lens and its first order differentiation with respect to z, $z_0$ is the position of the object plane, and s is the slope of swing optical axis.

In addition, a ferrite part 109 is arranged between a yoke 1064 of the objective lens 106 and the deflector units 1052 and 1053 to avoid the hysteresis that slows the response time of the deflector units 1052 and 1053.

It is known that the above operation mode of the deflection is the tilt scanning mode. In the present invention, the electron beam is tilted to scan the wafer for collecting 3D images, which is a lot less time-consuming than mechanically tilting the wafer carrier as prior art. U.S. Pat. No. 5,734,164. Another operation mode of deflection is the normal deflection mode, namely scanning the wafer with the normal incidence of the charged particle beam. Such a mode can reduce the chromatic aberration of deflection as following describe.

Figure 2A:
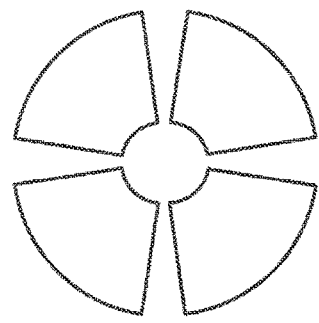
FIG. 2a is a diagram illustrating cross-sections of control electrodes are formed by 4, 8 or 12 spaced-apart plates.
Figure 2A:
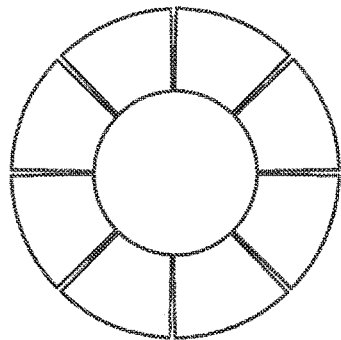
Figure 2A:
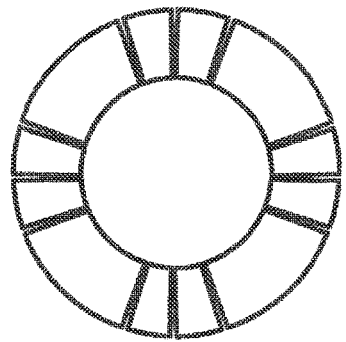
Figure 2B:
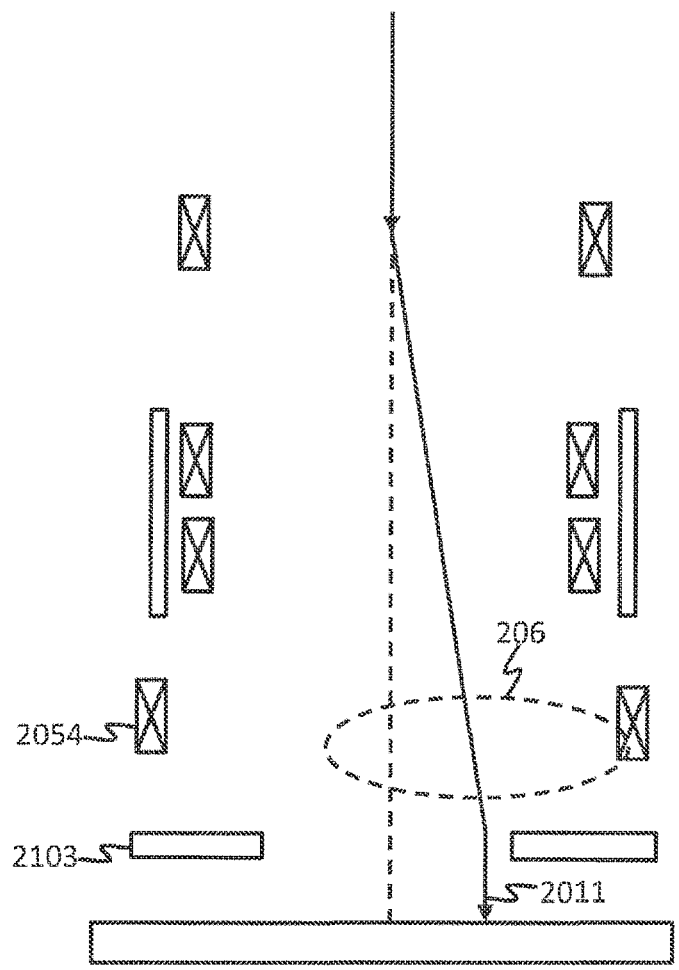
FIG. 2b is a diagram illustrating a moving objective retarding lens (MORL) which is formed by adjusting the electrostatic field of the control electrode.

Alternatively to the illustration in FIG. 1a, a control electrode 2103 can also be an electrode that makes the electron beam be orthogonal to the specimen surface by deflecting its electric field. Please refer to FIG. 2b, a normal illumination of an electron beam 2011 can be accomplished by adjusting the electrostatic field of the control electrode 2103. Therein, the control electrode 2103 is formed by 4, 8 or 12 spaced-apart plates as shown in FIG. 2a. However, while the probe beam irradiates obliquely the specimen surface, the off-axis aberration is deteriorating with the distance from the optical axis, which results in a severe edge aberration of image. In order to eliminate the aberration, in this example, a moving objective retarding lens (MORL) 206 is provided by modifying a voltage of a control electrode 2054 under the SORL condition. Therein, the MORL 206 is an equivalent lens for the system of the objective lens and the retarding lens.

A detector 108, which is arranged between the electron beam source 101 and the magnetic objective lens 106 within the beam guiding tube 107a, detects the signal electrons including secondary electrons and/or back-scattered electrons emanated from the specimen 1102. The signal electrons run in the opposite direction of the primary electron beam, which is accelerated by the combined effects of the electric field form the electrostatic retarding lens and magnetic fields from the magnetic objective lens 106 to improve the spatial resolution, and then can be selected by a Wien filter (velocity selector, not shown in FIG. 1a) and injected into the detector 108 for collecting images.

Alternatively to the illustration in FIG. 1a, the detector 108 can also be arranged between the specimen 1102 and the specimen-side of the magnetic objective lens 106. Since the detected signal electrons are quite weak when passing through the objective lens 106 to the deflector 108, an image of a sufficiently high signal-to-noise (S/N) ratio usually cannot be obtained. For this reason, the arrangement that makes the detector 108 close to the specimen 1102 can take advantage of capturing more signal electrons to collect image data.

Figure 3:
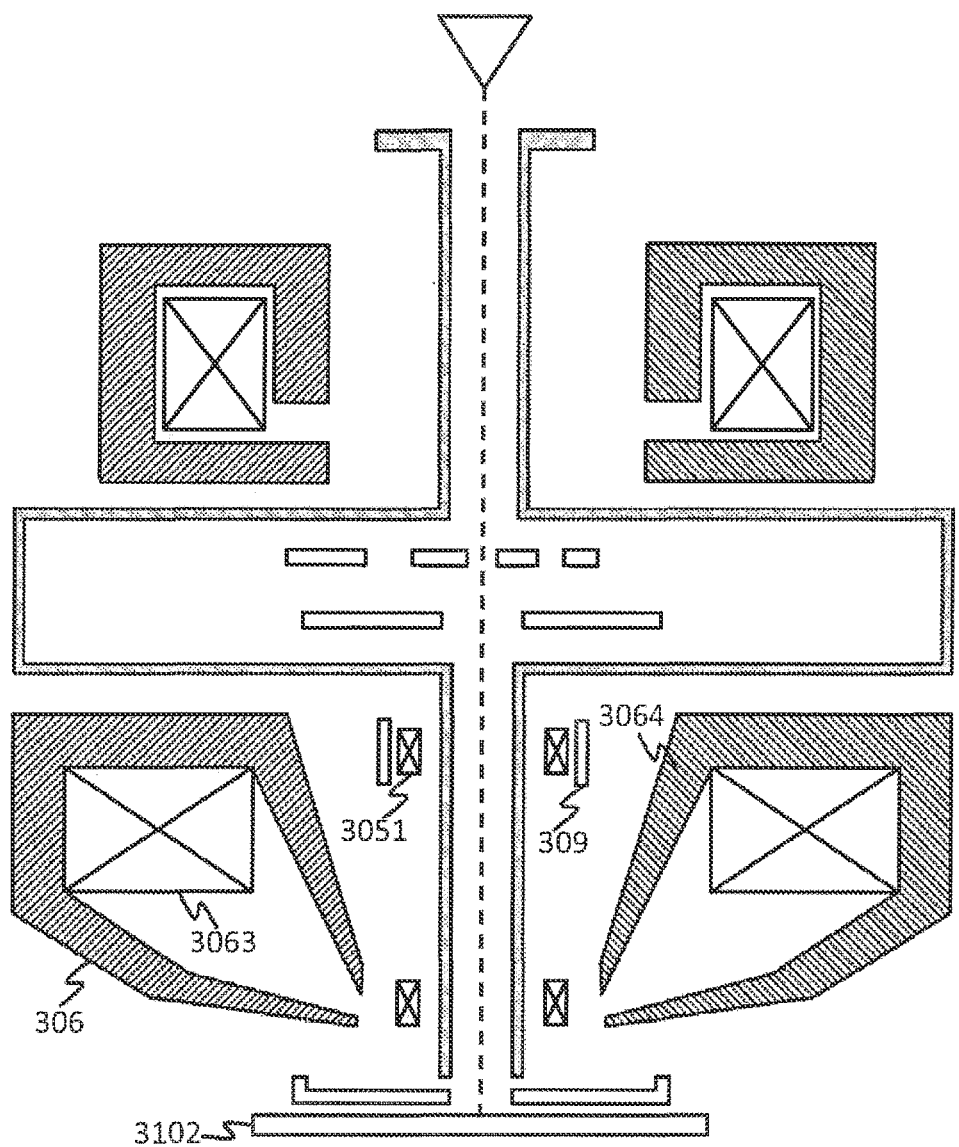
FIG. 3 gives an illustration of SEM with a beam guiding tube and a positioning group of deflection units, in which a scanning group of deflection units is incorporated into a control electrode.

Another embodiment, which is an alternatively example in section of the deflection system of FIG. 1a, is illustrated in FIG. 3. The difference between the two deflection systems of the two embodiments is that a scanning group of deflection units is incorporated into a control electrode 3103, in which the control electrode 3103 comprises 4, 8 or 12 spaced-apart plates. Thereby, the control electrode 3013 combines both functions of forming a retarding lens and scanning the wafer surface. In this manner, the chromatic aberration of deflection can be further improved due to the distance between the specimen 3102 and the scanning group (i.e., the control electrode) is quite short. A ferrite part 309 is arranged between a yoke 3064 of the objective lens 306 and the deflector units 3051 to avoid the hysteresis slowing the response time. Additionally, the control electrode 3103 can also produce the deflection of its electric field to make the electron beam be orthogonal to the specimen surface, which forms a MORL SEM.

Figure 4:
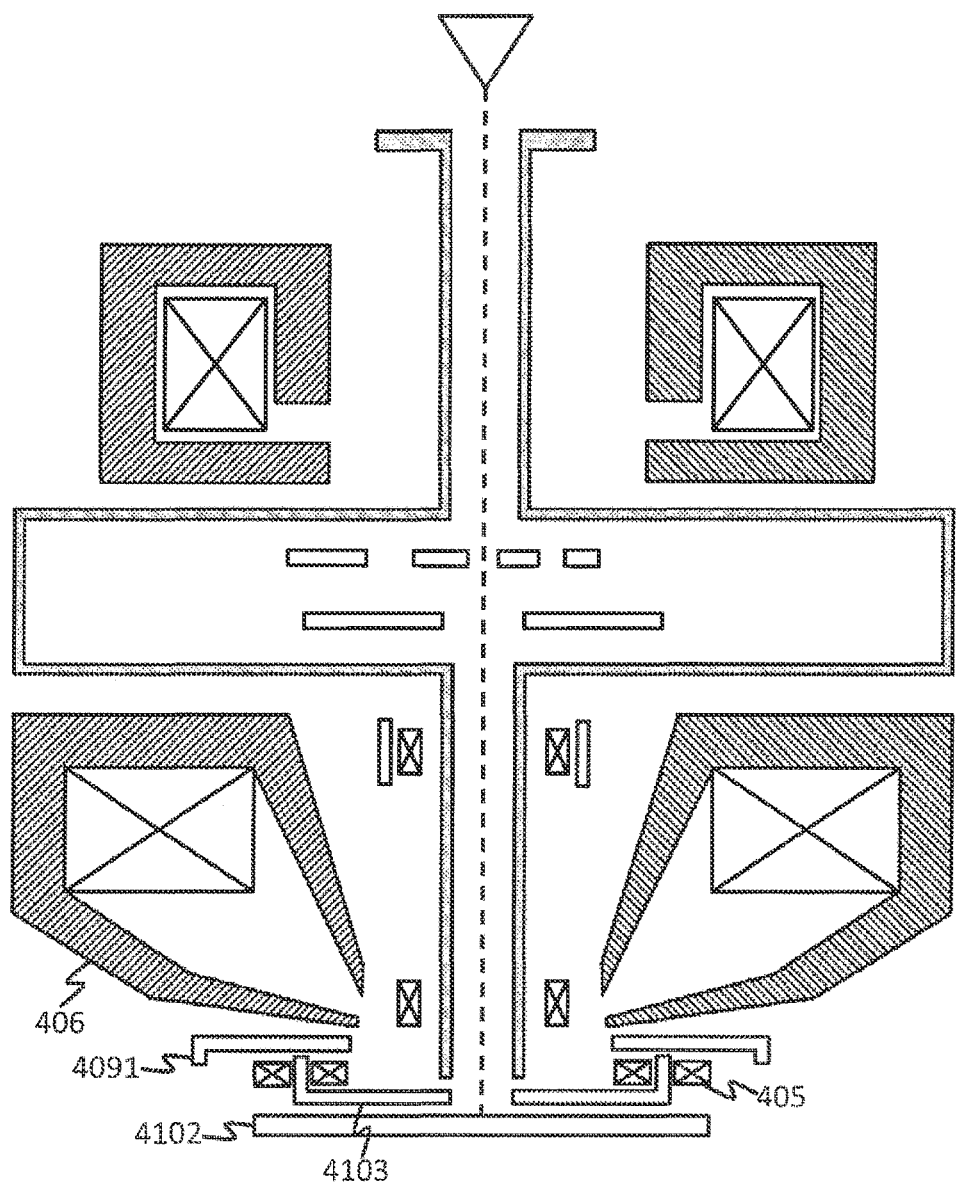
FIG. 4 shows a scanning group of deflection units arranged between an upper control electrode and a lower control electrode, which of them are situated between a specimen and the specimen-side of the magnetic objective lens.

Alternatively to the illustration in FIG. 3, a scanning group of deflection units including a magnetic deflector is arranged between a ferrite 4091 and a specimen 4102, as show in FIG. 4. A control electrode 4103, made of high magnetic conductor, has the multi-plates wound respectively by wind coils 405. While an excitation current is applied to the wind coils 405, the control electrode 4103 conducts the magnetic field from the coils 405 to deflect a primary electron beam. Therefore, the control electrode 4103 then can serve as the magnetic deflector, and meanwhile forming a retarding lens. The difference from the embodiment of FIG. 3 is that it is by the magnetic deflector incorporated into the control electrode 4013 to scan the wafer instead of the electric deflector 3013.

Figure 5:
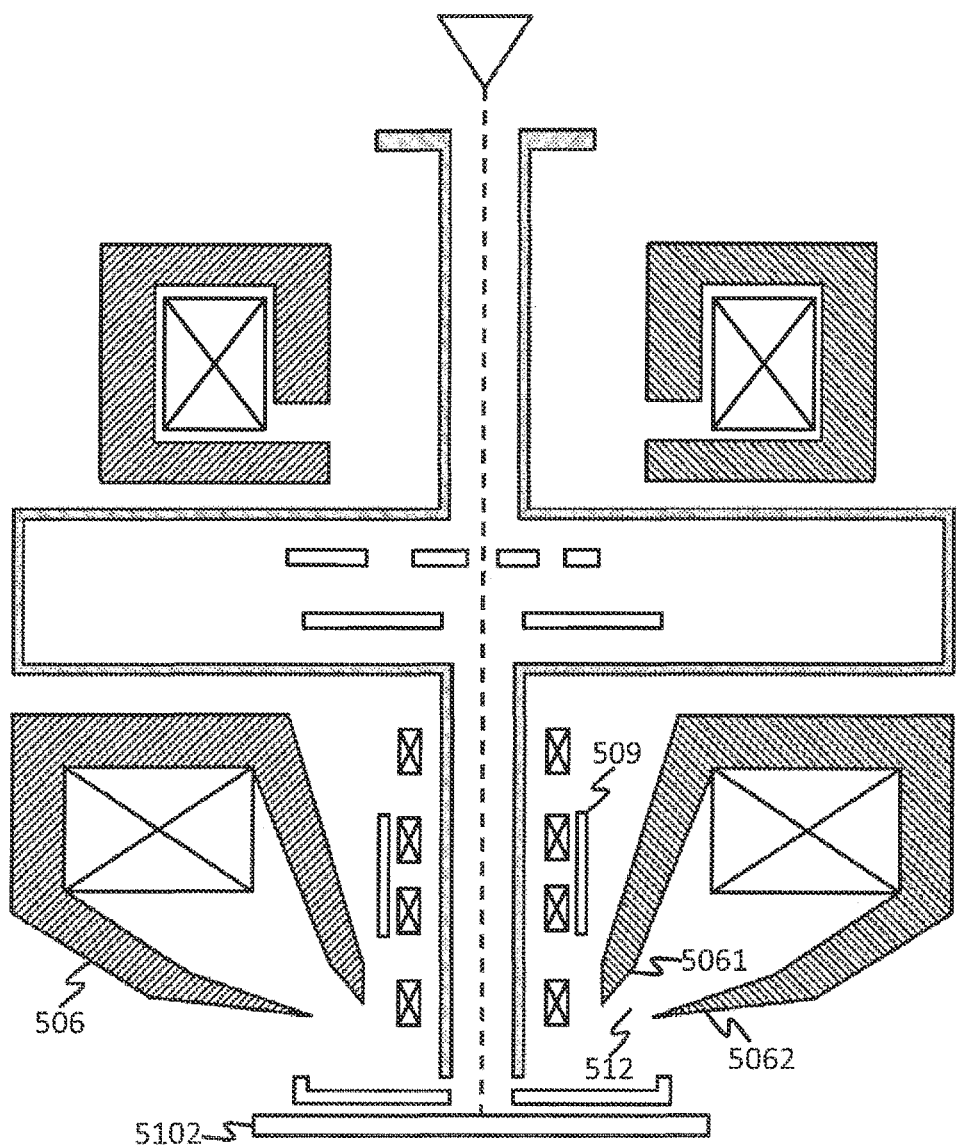
FIG. 5 shows a schematic diagram illustrating a swing objective retarding lens (SORIL) SEM with a beam guiding tube.

An alternative embodiment in section of the magnetic objective lens 106 of FIG. 1a is embodied as shown in FIG. 5. The difference from the embodiment of FIG. 1a is that an immersion magnetic objective lens 506 is provided as the objective lens. The immersion magnetic objective lens 506 generates an immersion magnetic field to immerse the specimen 5102 in a short working distance (WD). Therein, the immersion field is produced from a pole piece gap 512, which is defined by two pole pieces 5061 and 5062. Both of the aberration due to Coulomb effect (space-charge effect) and the chromatic aberration, therefore, can be improved. The Coulomb effect, which can enlarge the diameter of the electron beam, increases with the WD and results in a low resolution. So does the chromatic aberration. In the present invention, the large current beam is used so as to significantly limit the above aberrations relatively. By the short WD and immersion field of the immersion magnetic objective lens 506, the spot size can be efficiently limited and improve the resolution. Furthermore, a large field scan is provided herein as the embodiment of FIG. 1a such that a SEM comprising the immersion magnetic objective lens 506 and such the deflection system is called a swing objective retarding lens (SORIL) SEM.

Figure 6:
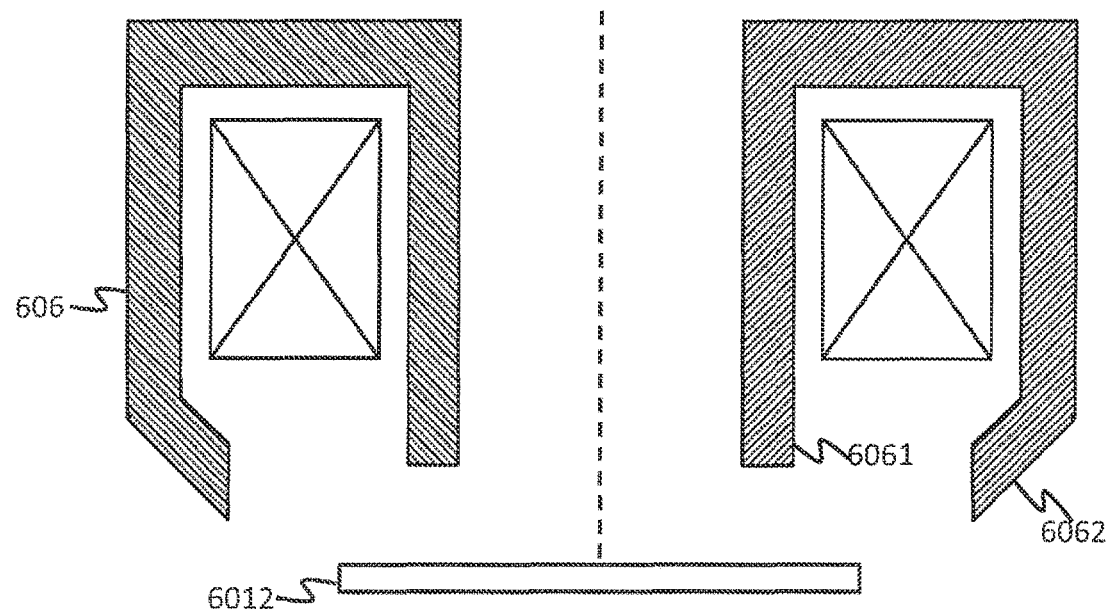
FIG. 6 illustrates a magnetic single-pole objective lens formed by an inner pole piece and an outer pole piece.

Referring to FIG. 6, an alternative example in section of the magnetic objective lens 106 of FIG. 1a is embodied. According to FIG. 6, an inner pole piece 6061 and an outer pole piece 6062 form a magnetic single-pole objective lens 606 in common, which can produce an immersion field to immerse a specimen 6012. The arrangement has the advantage of performing in a greater WD.

Furthermore, the defect-inspection apparatus in accordance with the present invention can be a combination of the above-mentioned embodiments in various forms. Each of the components of each of embodiments or certain features of them may be substituted for each other.

In summary, the present invention provides a defect-inspection apparatus targeted for semiconductor wafer surface defects inspected during the semiconductor fabrication processes and achieves high throughput, high resolution defect location and identification. Consequently, the present invention is expected to improve a semiconductor manufacturing yield, cost and time consuming.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An objective system for focusing a charged particle beam, comprising:
an objective lens for focusing the beam onto a specimen;
a beam guiding structure disposed through the objective lens for the beam;
a first deflection unit arranged in the objective lens for deflecting the beam;
a second deflection unit for deflecting the beam, the second deflection unit arranged below a portion of the first deflection unit; and
a ferrite structure arranged between the second deflection unit and the objective lens,
wherein a distance between the ferrite structure and the specimen is greater than a distance between the first deflection unit and the specimen.

2. The system according to claim 1, wherein the objective lens comprises a magnetic lens and an electrostatic lens, the beam guiding structure is an electrode for controlling kinetic energy of the beam, and the first deflection unit comprises a first magnetic deflector for deflecting the beam and a second magnetic deflector for swinging a compound field of the objective lens.

3. The system according to claim 2, wherein the electrostatic lens comprises a lower end of the beam guiding structure.

4. The system according to claim 1, wherein a specimen-side end of the beam guiding structure serves as a first electrode.

5. The system according to claim 4, wherein a surface of the specimen serves as a second electrode.

6. The system according to claim 5, further comprising a third electrode between the first electrode and the second electrode.

7. The system according to claim 6, wherein the third electrode serves as a control electrode.

8. The system according to claim 6, wherein the third electrode is disposed below the second deflection unit.

9. A charged particle beam device, comprising:
a beam source for generating a primary beam;
an objective lens to focus the primary beam onto a specimen;
a beam guiding structure for accelerating the primary beam, the beam guiding structure disposed through the objective lens;
a first deflection unit arranged in the objective lens for deflecting the primary beam;
a second deflection unit for deflecting the primary beam, the second deflection unit arranged below a portion of the first deflection unit; and
a ferrite structure arranged in the objective lens,
wherein a distance between the ferrite structure and the specimen is greater than a distance between the first deflection unit and the specimen.

10. The device according to claim 9, further comprising:
a retarding electrode disposed below the beam guiding structure for decelerating the beam; and
at least one detection unit disposed above the objective lens to detect secondary or back-scattered particles emanated from the specimen.

11. The device according to claim 10, wherein the retarding electrode adjusts a beam incidence angle from a tilt incidence angle to a normal incidence angle for an edge aberration.

12. The device according to claim 9, wherein a specimen-side end of the beam guiding structure serves as a first electrode.

13. The device according to claim 12, wherein a surface of the specimen serves as a second electrode.

14. The device according to claim 13, further comprising a third electrode between the first electrode and the second electrode, wherein the third electrode is disposed below the second deflection unit.

15. The device of claim 9, wherein the ferrite structure is arranged between the second deflection unit and the objective lens.

16. The device of claim 15, wherein the ferrite structure is a ferrite shield that is configured to minimize hysteresis slowing a response time of the second deflection unit.

17. The device of claim 9, wherein the first deflection unit comprises a first pair of deflectors and the second deflection unit comprises a second pair of deflectors.

18. The device of claim 17, wherein the ferrite structure is arranged between the objective lens and the second deflection unit.

19. The device of claim 18, wherein the ferrite structure is a ferrite shield that is configured to minimize hysteresis slowing a response time of the second deflection unit.

20. A method for directing a charged particle beam to a substrate, comprising the steps of:
   providing, using a beam guiding structure, a guiding field along a beam path to direct the beam to the substrate;
   focusing, using an objective lens, the beam to the substrate;
   generating, using a first deflection unit arranged in the objective lens, a first deflection field within the guiding field to direct the beam in a predetermined direction; and
   generating, using a second deflection unit arranged below a portion of the first deflection unit, a second deflection field downstream of the first deflection field for deflecting the beam, wherein a ferrite structure is arranged between the second deflection unit and the objective lens, and
   wherein a distance between the ferrite structure and the substrate is greater than a distance between the first deflection unit and the substrate.

\* \* \* \* \*